United States Patent [19]

Forrest et al.

[11] Patent Number: 4,473,835
[45] Date of Patent: Sep. 25, 1984

[54] LONG WAVELENGTH AVALANCHE PHOTODETECTOR

[75] Inventors: Stephen R. Forrest, Chatham; Ock-Ky Kim, Bridgewater; Richard G. Smith, Basking Ridge, all of N.J.

[73] Assignee: AT&T Bell Laboratories, Murray Hill, N.J.

[21] Appl. No.: 275,346

[22] Filed: Jun. 19, 1981

[51] Int. Cl.³ ............... H01L 27/14; H01L 29/161; H01L 29/90
[52] U.S. Cl. ............................. 357/30; 357/13; 357/16
[58] Field of Search ............... 357/30 A, 30 B, 30 E, 357/13, 16

[56] References Cited

U.S. PATENT DOCUMENTS 4,144,540  3/1979  Bottka ........................... 357/300 R
4,353,081  10/1982  Allyn et al. ........................ 357/16
4,383,269  5/1983  Capasso .......................... 357/16

OTHER PUBLICATIONS

H. Kanbe et al., "InGaAs avalanche photodiode with InP p-n junction", *Electronics Letters*, vol. 16, No. 5 (1980) pp. 163–165.

N. Susa et al., "New InGaAs/InP avalanche photodiode structure for the 1–1.6 μm wavelength region", *IEEE Journal of Quantum Electronics*, vol. QE-16, No. 8 (1980) pp. 864–870.

T. P. Pearsall et al., "A $Ga_{0.47}In_{0.53}As$/InP heterophotodiode with reduced dark current", *IEEE Journal of Quantum Electronics*, vol. QE-17, No. 2 (1981) pp. 255–259.

K. Taguchi et al., "InP-InGaAsP planar avalanche photodiodes with self-guard-ring effect", *Electronics Letters*, vol. 15 (1979) pp. 453–455.

T. Lee et al., "InGaAs/InP p-i-n photodiodes for lightwave communications at the 0.95–1.65 μm wavelength" *IEEE Journal of Quantum Electronics*, vol. QE-17 (1981) pp. 232–238.

N. Susa et al., "Characteristics in InGaAs/InP avalanche photodiodes with separated absorption and multiplication regions", *IEEE Journal of Quantum Electronics*, vol. QE-17, (1981) pp. 243–250.

M. Ito et al., "Tunneling currents in $In_{0.53}Ga_{0.47}As$ homojunction diodes and design of InGaAs/InP hetero-structure avalanche photodiodes", *Solid-State Electronics* vol. 24 (1981) pp. 421–424.

*Appl. Phys. Lett.*, vol. 37(9), Nov. 1, 1980, "Avalanche Multiplication and Noise Characteristics of Low-Dark-Current GaInAsP/InP Avalanche Photodetectors," pp. 807–810.

*Appl. Phys. Lett.*, vol. 35(3), Aug. 1, 1979, "InGaAsP Heterostructure Avalanche Photodiodes With High Avalanche Gain," pp. 251–252.

*IEEE Jr. of Quantum Electronics*, vol. QE-17, No. 2, Feb. 1981, "InGaAs/InP Separated Absorption and Multiplication Regions Avalanche Photodiode Using Liquid- and Vapor-Phase Epitaxies" pp. 250–254.

Primary Examiner—Andrew J. James
Assistant Examiner—J. Carroll
Attorney, Agent, or Firm—Arthur J. Torsiglieri

[57] ABSTRACT

An avalanche photodetector useful at wavelengths as long as 1.7 microns with low noise is achieved. The crystal used includes successive layers of p-type indium phosphide, n-type indium phosphide, and n-type indium gallium arsenide. An appropriate total of fixed charges in the n-type indium phosphide and a graded bandgap heterointerface region are important for the improved results.

5 Claims, 5 Drawing Figures

LONG WAVELENGTH AVALANCHE PHOTODETECTOR

TECHNICAL FIELD

This invention relates to photodetectors and more particularly to photodetectors which can provide high quantum efficiency, low noise and high gain at long wavelengths.

BACKGROUND OF THE INVENTION

The fact that the attenuation of low loss optical fibers tends to be especially low in the wavelength region between 1.3 and 1.6 microns has created a need for photodetectors efficient at such wavelengths. Of particular interest are avalanche photodetectors because of the intrinsic gain they provide. Hitherto it has proven difficult to realize sensitive avalanche photodetectors useful at wavelengths longer than 1.25 microns. In particular, in prior art devices designed for use at such long wavelengths, at voltages where photocurrent gain is realized, the tunneling currents and resultant shot noise tend to be large, limiting the sensitivity improvement of receivers using such detectors.

SUMMARY OF THE INVENTION

In one aspect the invention provides an avalanche photodetector useful at wavelengths as long as 1.7 microns, with insignificant tunneling leakage currents.

In particular, we provide a high gain $In_{0.53}Ga_{0.47}As$/InP avalanche photodiode with insignificant tunneling leakage current. In a preferred form this diode comprises a crystal including in succession a terminal region of p-type indium phosphide, an n-type region of indium phosphide and a terminal region of n-type indium gallium arsenide.

To keep the tunneling current insignificant, we have found it important to include a p-type InP buffer layer between the p-type InP terminal region and the n-type InP layer forming the p-n junction to reduce tunneling via deep levels in the high field p-n junction region. Additionally, we have found it important to control the effective total charge in the n-type InP layer to achieve optimum breakdown conditions before the onset of tunneling. In particular, in our preferred embodiment, it is important for the fixed charges per unit area in this layer to be between $2 \times 10^{12}$ per $cm^2$ and $3 \times 10^{12}$ per $cm^2$.

Additionally, in a separate aspect of our invention believed more widely applicable, we have found that the speed of response of a heterojunction photodetector of the kind described is significantly influenced by the barrier between the n-type InP layer and the n-type InGaAs absorbing terminal layer. In particular, we have found it important for high speed response to grade the bandgap of this heterointerface effectively to lower the barrier height of this junction to minimize charge storage effects and thereby to increase the speed of response. To this end, there is included a layer of InGaAsP at the heterointerface. In particular, in a preferred embodiment the growth conditions were adjusted to provide compositional grading at the interface between the InP and InGaAs regions, although it is also feasible to use simply a layer of InGaAsP.

DETAILED DESCRIPTION

Figure 1:
FIGS. 1 through 5 show an illustrative embodiment of the invention in successive stages of a typical fabrication process. For convenience, the drawing is not to scale.

With respect to the drawing in FIG. 1, there is shown for use as the substrate a crystal 10 of p-type InP uniformly doped with zinc to a concentration of about $10^{18}$ per $cm^3$ cut so that the major surface 11 corresponds to the <100> plane.

Figure 2:
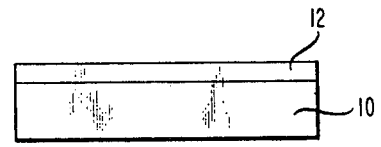

On this surface is grown by known liquid phase techniques, a p-type InP epitaxial buffer layer of from about 0.5 to 5.0 microns in thickness, preferably with a zinc concentration of between $10^{17}$ and $10^{18}$ atoms per cubic centimeter. In FIG. 2, this is shown as layer 12.

Figure 3:
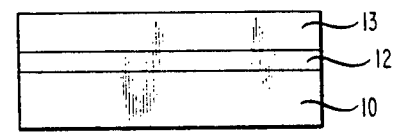

This is immediately followed by liquid phase growth in the same furnace of an InP layer 13 which is not intentionally doped, so that it grows n-type, as shown in FIG. 3. The thickness and fixed charge content of this n-type layer will determine the electric field at the heterointerface between this layer and the subsequently to be grown layer 14 at avalanche breakdown and therefore control of these parameters is important. Suitable values will be discussed in more detail below.

Figure 4:
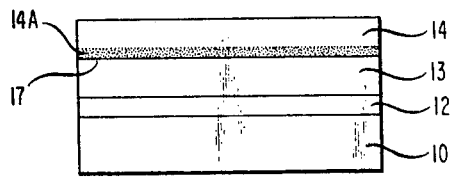

Next, as shown in FIG. 4, known liquid phase techniques are used to grow an epitaxial layer 14 of $In_{0.53}Ga_{0.47}As$, not intentionally doped, so that it grows n-type with a donor concentration of less than $5 \times 10^{15}$ per cubic centimeter. This layer advantageously is about 5 microns thick. As is discussed later, the heterointerface 17 between layers 13 and 14 is graded.

As should be evident to the worker in this art, the absorbing layer 14 can have a wide range of other compositions so long as the range permits adequate lattice matching to avoid crystalline imperfections that would limit efficiency. In particular, indium, gallium, arsenic and phosphorus can be used in varying proportions so long as the resulting bandgap is smaller than the energy of the photon to be absorbed.

In some instances, it may prove desirable to have lower resistance connections than it is easy to achieve to lightly doped indium gallium arsenide, and it may prove desirable to add a more heavily doped layer over layer 14 to facilitate connection thereto. Such a layer may be viewed as essentially part of the connection. Such a layer should be chosen to permit electrodes to be applied readily, but should have a composition which provides a sufficiently large bandgap that little light is absorbed therein.

However, as mentioned above, we have found it important for high speed of response to avoid too abrupt a barrier at the heterointerface between the layers 13 and 14. In particular, in an abrupt transition there is created a potential well where charges tend to be stored. While this offers some possibilities for use of such a structure as a memory, it militates against rapid response as a photodetector. Accordingly to grade the interface, the growth conditions of the layer 14 are chosen to cause some interdiffusion of components at the boundary between layers 13 and 14 to make for a more gradual change in the barrier height. Various techniques are known for this purpose, of which probably the easiest is to grow layer 14 initially at a low degree of undersaturation, typically 0.1 degrees Celsius undersaturation, to facilitate boundary grading between the InP and the InGaAs during its growth. Alternatively, a thin layer of intermediate composition can be grown between layers 13 and 14 by known liquid phase epitaxial techniques. Conditions are adjusted to provide a graded region 14A, shown stippled in the drawing, of indium gallium arsenide phosphide preferably of about 500-1000 Angstroms in thickness for operation of the detector with an applied reverse bias of between 80 volts and 150 volts to insure avalanche multiplication during operation.

As mentioned above, the thickness and doping of the layer 13 largely determines the electric field at the heterojunction interface 17 between layers 13 and 14 at avalanche breakdown, and control of these parameters is important.

The electric field E at this heterointerface 17 is given $$\text{by } E = \frac{q}{e} \int_{X_1}^{W} N(x)\,dx = \frac{q}{e}\sigma$$

where $N(x)$ is the fixed charge density at a distance x from the p-n junction $X_1$ is the distance of the interface from the p-n junction, W is the total depletion region width, q is the electronic charge, and e is 1.04 pF/cm, the permittivity of layer 14. Thus, $\sigma$ is the total charge per unit area swept out in layer 14. It can be shown that for tunneling at the heterointerface 17 to be essentially absent at the breakdown voltage that $E \leq 1.5 \times 10^5$ V/cm. This implies that $\sigma \leq 1.0 \times 10^{12}$ cm$^{-2}$.

It is also important that the field at the p-n junction be large enough for significant current gain at breakdown. Our analysis has shown that the most sensitive avalanche photodiodes are obtained when the layer 13 has a total fixed charge value of $\sigma$ equal to or greater than about $2 \times 10^{12}$ per cm$^2$. However, for $\sigma$ greater than about $3 \times 10^{12}$ per cm$^2$ the layer 13 is not completely depleted at breakdown, resulting in very low quantum efficiency. Accordingly, the value of $\sigma$ should be in the range between about $2 \times 10^{12}$ cm$^{-2}$ and $3 \times 10^{12}$ cm$^{-2}$ for optimum results.

In one embodiment, layer 13 was made with a thickness of about 2 microns and the concentration of donors in this layer was about $10^{16}$ cm$^{-3}$ resulting in a $\sigma$ of about $2 \times 10^{12}$ cm$^{-2}$.

Figure 5:
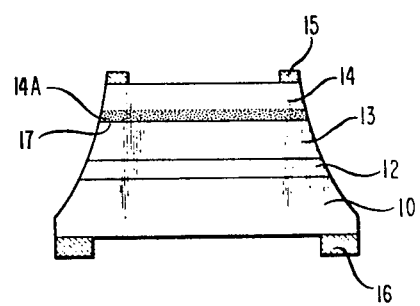

To reduce capacitance and edge field effects it is desirable to shape the resulting diode into a mesa structure as seen in FIG. 5. Typically the mesa is defined using standard photolithographic techniques and etched with a 1 percent bromine-methanol solution. A circular area of about $1.3 \times 10^{-4}$ cm$^2$ is typical for the smaller top surface. Low resistance connections 15,16 are made to terminal layers 10 and 14, respectively, by means of alloyed electrodes. In our specific embodiment, gold-zinc was used to contact layer 10 and gold-tin was used to contact layer 14.

In use, an appropriate reverse bias would be established between such electrodes to achieve the desired avalanche operation.

Of course, other techniques and geometries can be used for fabrication including, for example, molecular beam epitaxy, or chemical vapor deposition. Similarly, it is feasible to grow the basic elements of the avalanche photodetector shown in FIG. 5, layers 12, 13, and 14, upside down. In such a case, one begins with a substrate of n-type indium phosphide on which is grown an n-type indium-gallium arsenide layer, corresponding to layer 14, which serves as the absorbing layer. On this is grown, in turn, an indium-phosphide layer corresponding to layer 13 and a p-type indium phosphide layer corresponding to layer 12. If desired, a buffer layer can be interposed between the n-type indium gallium arsenide layer and the n-type indium phosphide substrate in the form of a separately grown n-type layer of indium phosphide to facilitate the growth of the n-type indium gallium arsenide layer. The design considerations discussed are similarly applicable. Similarly, while a mesa structure has been specifically described, a planar geometry may in some instances be preferred.

What is claimed is:

1. A semiconductive device useful as an avalanche photodetector comprising means forming connections for applying operating voltages to such device and a semiconductive crystal electrically between such means, such crystal comprising in succession a first region of p-type indium phosphide, a second region contiguous to the first region of n-type indium phosphide, a third region contiguous with the second region of n-type indium gallium arsenide phosphide, and a fourth region contiguous with the third region of n-type indium gallium arsenide, the n-type indium phosphide region having a fixed charge in the range to minimize tunneling in the fourth region and to allow for avalanching in the second region, and the third region being of a thickness and composition to reduce storage effects.

2. A device in accordance with claim 1 further characterized in that the third region is at least several hundred Angstroms wide.

3. A device in accordance with claim 1 further characterized in that the third region is in the range of 500-1000 Angstroms thick.

4. A device in accordance with claim 1 in which the third region has its composition graded between indium phosphide and indium gallium arsenide.

5. A device in accordance with claim 4 in which the third region is at least several hundred Angstroms and in which the second and third regions are more lightly doped than the first region.

* * * * *